United States Patent
Onishi et al.

(10) Patent No.: US 8,625,248 B2
(45) Date of Patent: Jan. 7, 2014

(54) ELECTROSTATIC DISCHARGE PROTECTOR

(75) Inventors: Mina Onishi, Tokyo (JP); Yoshimitsu Ishihara, Tokyo (JP); Hirofumi Inoue, Tokyo (JP); Yukihiko Azuma, Hachioji (JP)

(73) Assignee: Showa Denko K.K., Tokyo (JP)

( * ) Notice: Subject to any disclaimer, the term of this patent is extended or adjusted under 35 U.S.C. 154(b) by 189 days.

(21) Appl. No.: 13/123,262

(22) PCT Filed: Oct. 6, 2009

(86) PCT No.: PCT/JP2009/067415
§ 371 (c)(1),
(2), (4) Date: Apr. 8, 2011

(87) PCT Pub. No.: WO2010/041661
PCT Pub. Date: Apr. 15, 2010

(65) Prior Publication Data
US 2011/0194225 A1    Aug. 11, 2011

(30) Foreign Application Priority Data
Oct. 10, 2008 (JP) ................................. 2008-264239

(51) Int. Cl.
*H02H 1/04* (2006.01)
*H02H 3/22* (2006.01)

(52) U.S. Cl.
USPC .............................. 361/127; 361/126; 338/21

(58) Field of Classification Search
USPC ............................ 361/212, 127, 126; 338/21
See application file for complete search history.

(56) References Cited

U.S. PATENT DOCUMENTS

| | | | | |
|---|---|---|---|---|
| 5,083,650 A * | 1/1992 | Seiz et al. | ................ | 192/107 M |
| 5,124,888 A * | 6/1992 | Suzuki et al. | ................. | 361/740 |
| 5,260,848 A * | 11/1993 | Childers | ........................ | 361/127 |
| 5,807,509 A | 9/1998 | Shrier et al. | | |
| 6,251,513 B1 | 6/2001 | Rector et al. | | |
| 6,657,532 B1 | 12/2003 | Shrier et al. | | |
| 7,872,251 B2 * | 1/2011 | Kosowsky et al. | ................ | 257/3 |
| 2003/0089964 A1 | 5/2003 | Belman | | |
| 2005/0276001 A1 | 12/2005 | Matsuoka et al. | | |
| 2006/0061925 A1 | 3/2006 | Shrier | | |

(Continued)

FOREIGN PATENT DOCUMENTS

| JP | 10-270145 A | 10/1998 |
|---|---|---|
| JP | 10-312876 A | 11/1998 |

(Continued)

OTHER PUBLICATIONS

MatWeb, Material Property Data, internet source for material information, Jan. 17, 1999. Pertinent pages are provided.*

(Continued)

*Primary Examiner* — Rexford Barnie
*Assistant Examiner* — Zeev V Kitov
(74) *Attorney, Agent, or Firm* — Sughrue Mion, PLLC

(57) ABSTRACT

The present invention provides an electrostatic discharge protector capable of protecting electronic circuit boards having various designs from electrostatic discharge freely, simply and easily. The electrostatic discharge protector of the present invention comprises at least three conductive members containing one pair of electrodes and the conductive members other than the electrodes, the conductive members are each disposed in such a way that the gap between one conductive member and the other conductive member has a width of 0.1 to 10 μm, an insulating member is disposed and embedded in at least one of gaps having a width of 0.1 to 10 μm which are adjacent to each conductive member and one electrode is connected to the other electrode paired with the one electrode through the insulating member and the conductive members other than electrodes.

14 Claims, 2 Drawing Sheets

(56) References Cited

U.S. PATENT DOCUMENTS

| | | |
|---|---|---|
| 2007/0127175 A1 | 6/2007 | Shrier |
| 2009/0237855 A1 | 9/2009 | Shrier |
| 2012/0200963 A1* | 8/2012 | Vasquez et al. ............. 361/56 |

FOREIGN PATENT DOCUMENTS

| | | |
|---|---|---|
| JP | 2001-523040 T | 11/2001 |
| JP | 2003-297524 A | 10/2003 |
| JP | 2005-510079 A | 4/2005 |
| JP | 2005-353845 A | 12/2005 |
| JP | 2007-242242 A | 9/2007 |
| JP | 2007-266479 A | 10/2007 |

OTHER PUBLICATIONS

Extended European Search Report dated Sep. 16, 2013 issued in corresponding European Patent Application No. 09819195.0.

* cited by examiner

Wiring thickness: 15 μm
Distance between the adjacent wirings: 15 μm

ELECTROSTATIC DISCHARGE PROTECTOR

FIELD OF THE INVENTION

The present invention relates to an electrostatic discharge protector, and more particularly, it relates to an electrostatic discharge protector capable of protecting electronic circuit boards having various designs against electrostatic discharge freely, simply and easily.

TECHNICAL BACKGROUND

Electrostatic discharge (ESD) is one of destructive and unavoidable phenomena that electric systems and integrated circuits are attacked. From the electric view, ESD is a transitional high current phenomenon such that a peak current of several amperes continues for a period of time from 10 n sec to 300 n sec. Therefore, when ESD is generated, an integrated circuit is damaged so that it is hardly repaired, or its volume breaks down or deteriorates so that it does not work normally unless a current of several amperes is conducted outside the integrated circuit within several nano sec. Furthermore, the lightening, thinning and downsizing for electronic parts or electronic apparatuses advance rapidly in recent years. With the rapid progress, the degree of integration in semiconductors and the density of electronic parts mounted on printed wiring boards are increased remarkably with the result that integration is minute, or electronic elements or signal conductors mounted are present very closely each other. Under these circumstances, high frequency radiation noise is easily caused together with the accelerating of the signal-processing rate.

Conventionally, as an element for protecting from static electricity, which protects IC etc. in circuits from ESD, JP-A-2005-353845 discloses an element having a bulk structure, which comprises a sintered matter of a metal oxide etc. This element is a laminated chip varistor made from the sintered matter and is equipped with a laminate and one pair of external electrodes. The varistor has a property such that when the applied voltage reaches a certain value, the current, which has not been flown until now, begins to flow suddenly, and also has excellent blocking force to electrostatic discharge. However, in the production of the laminated chip varistor, which is a sintered matter, a complicated production process including sheet molding, internal electrode printing, sheet lamination, etc. is inevitable and the production also has a problem that delamination and other wrong conditions are easily caused during mounting.

JP-A-2007-266479 discloses a protective element that on an insulating substrate, a discharge gap of 10 μm to 50 μm is formed and between one pair of electrode patterns which ends are faced each other, a functional film, which comprises ZnO as a main component and silicon carbide, is formed. As compared with the laminated chip varistor, the protective element has a merit that it can be produced on a substrate as a thick film element having a simple composition.

For these ESD protective elements, the reduction of the mounted area has been undertaken according to the progress of electronic apparatuses. However, since an element is mounted on a wiring substrate by soldering, the degree of the freedom in the design is low and it has limitations of the size including height. On this account, the provision for ESD does not limit to elements, and further, it is desired that the provision for ESD be practiced on a necessary part and a necessary area.

WO/2001/523040 is a document that a resin composition is disclosed as an ESD protective material. This resin composition comprises a base material made from a mixture of an insulating binder, conductive particles having an average particle diameter of less than 10 micron and semiconductor particles having an average particle diameter of less than 100 micron. Furthermore, WO/2001/523040 also discloses the US patent invented by Hyatt et al and discloses a composition material that a mixture of conductive particles which surfaces are covered with an insulating oxide film, and semiconductor particles is combined by an insulating binder, a composition material which particle diameter range is determined, and a composition material that the surface gaps among conductive particles are determined. The methods described in the publications have technically unstable problems such that a high electric resistance value is not obtained at a low voltage or a low electric resistance value is not obtained at a high voltage, because the method of dispersing the conductive particles and the semiconductor particles is not optimized.

Moreover, the process for producing the electrostatic discharge protector has the following difficult problems. For example, the electrostatic discharge protector is required to have a high insulating resistance property at a normal operating voltage (usually the voltage shows less than 10 V). When an insulating member is not disposed between electrodes, aerial discharge is caused by application of a high voltage, and the electrodes are short-circuited by carbonization of a substrate provided with the electrodes. Therefore, it is necessary to dispose any member having voltage resistance between the electrodes. When the conductive member is only disposed but the insulating member is not disposed, the insulating resistance is not maintained. Therefore, it is essential that the insulating member is disposed in the gap between one pair of the electrodes. In the trial, when the insulating member is disposed so as to be bridged between the electrodes, it is possible to add high insulating resistance at a normal operating voltage and low electric resistance at the time of electrostatic discharge by optimizing the distance between the electrodes to the providing insulating member.

For example, when the filler-free resin is used for the insulating member, the property as the electrostatic discharge protector is confirmed by determining the distance between the electrodes to 5 to 7 μm. However, when the electrostatic discharge protector comprises only one pair of the electrodes and the insulating member, it is difficult to produce it industrially because the proper distance of the electrodes is changed by a fine difference on quality in the insulating member and the permissible range of the distance between the electrodes is very small.

PRIOR ART

Patent document 1: JP-A-2005-353845
Patent document 2: JP-A-2007-266479
Patent document 3: WO/2001/523040

SUMMARY OF THE INVENTION

Subject to be Solved by the Invention

The present invention is intended to solve the above problems and it is an object of the invention to provide an electrostatic discharge protector capable of freely, simply and easily taking measures against ESD in variously designed electronic circuit boards.

Means for Solving the Solvent

The present inventors have been studied in order to solve the problems associated with the prior arts, and found that the subject was solved by disposing, on an electric circuit board, an electrostatic discharge protector having a structure such that a conductive member is disposed between electrodes with a definite gap and these members are joined by an insulating member.

Namely, the present invention relates to the following items.

[1] An electrostatic discharge protector comprising at least three conductive members containing a pair of electrodes and conductive members other than the electrodes wherein each conductive member is disposed so as to have a gap width of 0.1 to 10 μm between one conductive member and at least one of other conductive members, an insulating member is disposed and embedded in at least one of gaps having a width of 0.1 to 10 μm which are adjacent to each conductive member, and one of the electrodes is connected to the other electrode paired with the one electrode through the insulating member and the conductive members other than the electrodes.

[2] An electrostatic discharge protector comprising one pair of electrodes, a conductive member disposed to have a gap width of 0.1 to 10 μm with each of the one pair of the electrodes and an insulating member, which is disposed in the gap and connects each of the electrodes and the conductive member.

[3] The electrostatic discharge protector according to [1] or [2] wherein the insulating member has an electric resistivity of $10^{10}$ Ω·cm or more, at the time of application of a voltage of DC10V.

[4] The electrostatic discharge protector according to any one of [1] to [3] wherein the insulating member is a molded article formed from a resin composition.

[5] The electrostatic discharge protector according to [4] wherein the molded article is a layered article obtainable by applying a curing resin composition comprising a curing resin, followed by curing.

[6] The electrostatic discharge protector according to [4] or [5] wherein the resin composition comprises an inorganic or organic filler.

[7] The electrostatic discharge protector according to any one of [1] to [6] wherein the conductive members other than the electrodes have an electric resistivity of not more than $10^3$ Ω·cm, at the time of application of a voltage of DC10V.

[8] The electrostatic discharge protector according to any one of [1] to [7] wherein the conductive members other than the electrodes are molded articles formed from a conductive resin composition.

[9] The electrostatic discharge protector according to [8] wherein the molded articles formed from the conductive resin composition are layered articles having a thickness of 1 to 100 μm.

[10] The electrostatic discharge protector according to [8] or [9] wherein the conductive resin composition comprises conductive particles and/or conductive fibers in an amount of 1 to 80% by volume.

[11] The electrostatic discharge protector according to [10] wherein the conductive particles are carbon particles.

[12] The electrostatic discharge protector according to [10] wherein the conductive particles are graphite, and the conductive fibers are carbon fibers.

[13] The electrostatic discharge protector according to any one of [1] to [12] wherein the gap width is 1 to 10 μm.

[14] An electronic circuit board provided with the electrostatic discharge protector as described in any one of [1] to [13].

[15] An electronic apparatus provided with the electronic circuit board as described in [14].

Effect of the Invention

The electrostatic discharge protector of the present invention can attain electrostatic discharge protection by simply, easily and freely disposing the electrostatic discharge protector on a necessary place in a necessary area without carrying out particular and complicated steps. Therefore, the electrostatic discharge protectors can be suitably used to digital apparatuses including cellular phones, mobile apparatuses, which are frequently touched by user's hands, and other apparatuses.

EMBODIMENT FOR CARRYING OUT THE INVENTION

Figure 1:
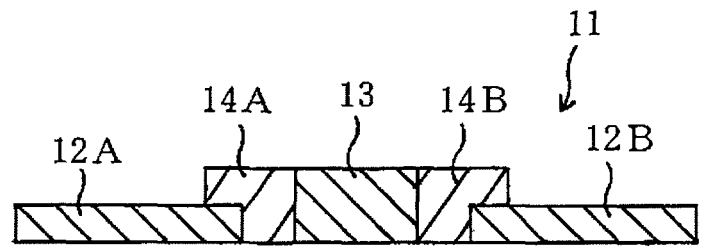
FIG. 1 is a vertical section of an electrostatic discharge protector 11, which is one embodiment of the electrostatic discharge protectors according to the present invention.

The electrostatic discharge protector according to the present invention will be described in detail below.

The electrostatic discharge protector according to the present invention is characterized in that it comprises at least three conductive members containing a pair of electrodes and conductive members other than the electrodes, each conductive member is disposed having a gap width of 0.1 to 10 μm with at least one of other conductive members, an insulating member is disposed and embedded in at least one of gaps having a width of 0.1 to 10 μm which are adjacent to each conductive member, and one of the electrodes is connected to the other electrode paired with the one electrode through the insulating member and the conductive members other than the electrodes.

In the electrostatic discharge protector of the present invention, when the plural conductive members are contacted each other, they are regarded as one conductive member. For example, when electrodes and conductive members other than the electrodes are contacted, they are regarded as one conductive member and one electrode.

Structure of Electrostatic Discharge Protector

The electrostatic discharge protector according to the present invention comprises at least three conductive members and at least two of the conductive members are one pair of electrodes. Namely, the electrostatic discharge protector of the present invention comprises one pair of electrodes and at least one conductive member as essential components, and optionally comprises other pairs of electrodes and other conductive members other than the other pairs of electrodes. Therefore, the conductive member may comprise a pair of two electrodes and one or two or more conductive members other than the electrodes, or may comprise two pairs of four electrodes and one or two or more conductive members other than the electrodes. When the conductive member comprises three or more pairs of electrodes, the following manner is also adapted.

These conductive members are each disposed with a gap having a width of 0.1 to 10 μm between the one and at least one of other conductive members. Namely, any one of the above-described conductive members is necessarily disposed with a gap having a width of 0.1 to 10 μm between the one and any other conductive member. That is to say, each of the conductive members is not disposed with a gap having a width of over 10 μm between one and any other conductive member.

Herein, the width of the gap between the conductive members means the shortest distance between the conductive members.

In the gap having a width of 0.1 to 10 μm between one conductive member and other conductive member, the insulating member is disposed and embedded, and the one conductive member and the other conductive member are joined through the insulating member. Namely, the insulating member is disposed so as to be sandwiched with the one conductive member and the other conductive member. When there is a plurality of other conductive members with a gap having a width of 0.1 to 10 μm, an insulating member may be disposed in at least one of the gaps. That is to say, each of the conductive members is always in contact with the insulating member and the insulating member is always in contact with the other conductive member in a part different from the part that is in contact with the conductive member.

Furthermore, three or more conductive members may be in contact with each other through one or two or more insulating members. For example, when the width of the gap between a conductive member A and a conductive member B is 0.1 to 10 μm and the width of the gap between the conductive member B and a conductive member C is 0.1 to 10 μm, an insulating member AB is disposed between the conductive member A and the conductive member B and an insulating member BC is disposed between the conductive member B and the conductive member C. In this case, these members are connected in the order of the conductive member A, the insulating member AB, the conductive member B, the insulating member BC and the conductive member C. The case of four or more conductive members can be considered in a similar manner as above.

The width of the gap between one conductive member and other conductive member that is present most closely with the one conductive member is 0.1 to 10 μm, so that the thickness of the insulating member sandwiched with the one conductive member and the other conductive member is 0.1 to 10 μm.

In the electrostatic discharge protector of the present invention, the members are each connected as described above, and one of the electrodes is connected to the other electrode paired with the one electrode through the insulating member and the conductive member other than electrodes. For example, in the case of comprising one pair of two electrodes and one conductive member other than the electrodes as a conductive member, the one electrode, the insulating member and the conductive member other than the electrodes, the insulating member and the other electrode are connected in this order. In the case of comprising one pair of two electrodes and two or more conductive members other than the electrodes as a conductive member, the members can be connected in the same manner as above. Furthermore, in the case of comprising two or more pairs of electrodes, each pair of electrodes can be connected in the same manner as above.

Incidentally, when there are two or more gaps among the conductive members and the insulating material is disposed on each of the gaps, it is possible to dispose the insulating material on each gap, or it is possible to dispose a part of the insulating member on one gap and dispose the other part of the insulating member on the other gap.

As an example of the electrostatic discharge protector of the present invention, there is, for example, an electrostatic discharge protector, which comprises one pair of electrodes, a conductive member disposed so as to have a gap having a width of 0.1 to 10 μm with each of the electrodes, and an insulating member disposed between the gaps so as to connect each of the electrodes and the conductive member.

FIG. 1 shows a vertical section of an electrostatic discharge protector 11 which is one embodiment of the electrostatic discharge protector. The electrostatic discharge protector 11 comprises an electrode 12A, an electrode 12B, a conductive member 13, an insulating member 14A and an insulating member 14B. The electrode 12A and the electrode 12B are disposed in such a way that their axes directions are identical and their top surfaces are faced each other. The insulating member 14A is disposed in such a way that it is in contact with and overlays the top of the electrode 12 A which top is faced to the top surface of the electrode 12B from the upper side. The insulating member 14B is disposed in such a way that it is in contact with and overlays the top of the electrode 12 B which top is faced to the top surface of the electrode 12A from the upper side. The conductive member 13 is disposed in such a way that it is sandwiched with the insulating member 14A and the insulating member 14B and in contact with the insulating member 14A and the insulating member 14B. The width of the gap between the electrode 12A and the conductive member 13 is 0.1 to 10 μm. In the insulating member 14A, the thickness of the part sandwiched between the electrode 12A and the conductive member 13 is the same as the width of the above described gap. The width of the gap between the electrode 12B and the conductive member 13 is 0.1 to 10 μm. In the insulating member 14B, the thickness of the part sandwiched between the electrode 12B and the conductive member 13 is the same as the width of the above described gap. As described above, in the electrostatic discharge protector 11, the electrode 12A is connected with the electrode 12B through the insulating member 14A, the conductive member 13 and the insulating member 14B.

Figure 2:
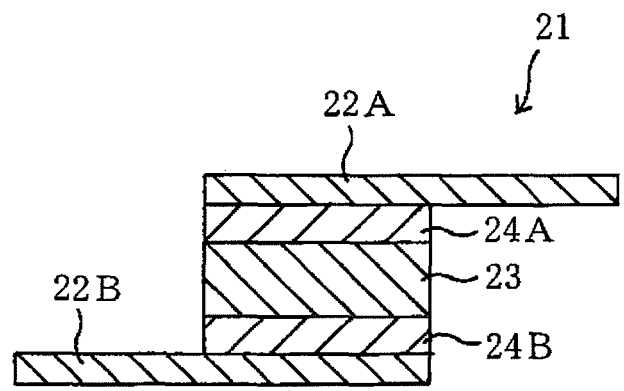
FIG. 2 is a vertical section of an electrostatic discharge protector 21, which is one embodiment of the electrostatic discharge protectors according to the present invention.

FIG. 2 shows a vertical section of an electrostatic discharge protector 21 which is one embodiment of the electrostatic discharge protector. The electrostatic discharge protector 21 comprises an electrode 22A, an electrode 22B, a conductive member 23, an insulating member 24A and an insulating member 24B. The insulating member 24A has a rectangular cross section and is disposed in contact with the side surface of the electrode 22A. The conductive member 23 has a rectangular cross section and is disposed in contact with the insulating member 24A in such a way that the insulating member 24A is sandwiched with the conductive member 23 and the electrode 22A. The width of the gap between the electrode 22A and the conductive member 23 is 0.1 to 10 μm. In the insulating member 24A, the thickness of the part sandwiched with the electrode 22A and the conductive member 23 is the same as the width of the above-described gap. The insulating member 24B has a rectangular cross section and is disposed in contact with the conductive member 23 in such a way that the conductive member 23 is sandwiched with the insulating member 24B and the insulating member 24A. The electrode 22B is disposed in contact with the insulating member 24B on a parallel with the electrode 22A in such a way that the insulating member 24B is sandwiched with the electrode 22B and the conductive member 23. The width of the gap between the electrode 22B and the conductive member 23 is 0.1 to 10 µm. In the insulating member 24B, the thickness of the part sandwiched with the electrode 22B and the conductive 23 is the same as the width of the above described gap. As described above, in the electrostatic discharge protector 21, the electrode 22A is connected with the electrode 22B through the insulating member 24A, the conductive member 23 and the insulating member 24B.

Figure 3:
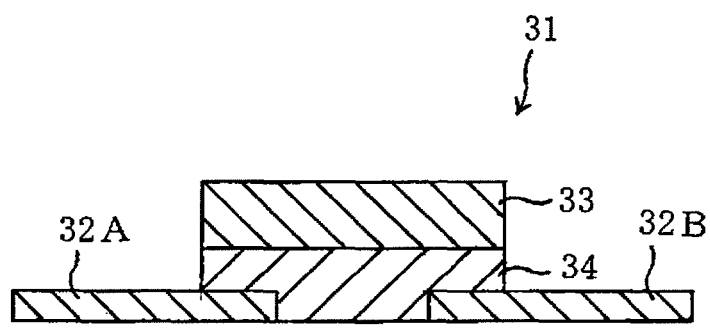
FIG. 3 is a vertical section of an electrostatic discharge protector 31, which is one embodiment of the electrostatic discharge protectors according to the present invention.

FIG. 3 shows a vertical section of an electrostatic discharge protector 31, which is one embodiment of the electrostatic discharge protector. The electrostatic discharge protector 31 comprises an electrode 32A, an electrode 32B, a conductive member 33, and an insulating member 34. The electrode 32A and the electrode 32B are disposed in such away that the axes of the electrodes are identical each other and the gap between the end portion surfaces faced each other has a width of more than 10 µm. The insulating member 34 is disposed in contact with the electrode 32A and the electrode 32B in such a way that the end portion surfaces of the electrode 32A and the electrode 32B are covered by the lower surface of the insulating member 34. The conductive member 33 has a rectangular cross section and is disposed on the upper surface of the insulating member 34. The width of the gap between the electrode 32A and the conductive member 33, and the width of the gap between the electrode 32B and the conductive member 33 are 0.1 to 10 µm. In the insulating member 34, the part sandwiched between the electrode 32A and the conductive member 33, and the part sandwiched between the electrode 32B and the conductive member 33 have each the same gap width as described above. In the electrostatic discharge protector 31, the insulating member 34 is disposed on both of the gap between the electrode 32A and the conductive member 33 and the gap between the electrode 32B and the electrode member 33. As described above, in the electrostatic discharge protector 31, the electrode 32A is connected with the electrode 32B through the insulating member 34 and the conductive member 33.

Figure 4:
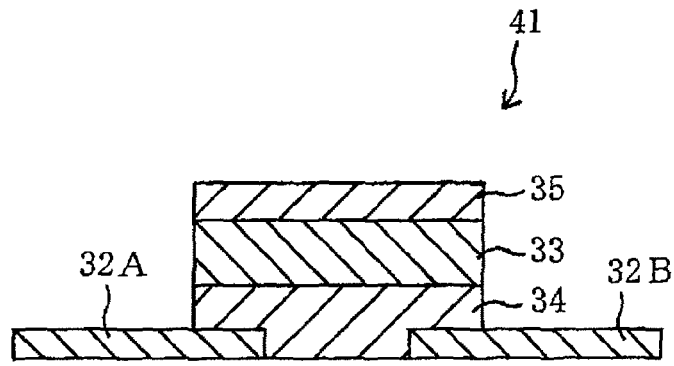
FIG. 4 is a vertical section of an electrostatic discharge protector 41, which is one embodiment of the electrostatic discharge protectors according to the present invention.

FIG. 4 shows a vertical section of an electrostatic discharge protector 41, which is one embodiment of the electrostatic discharge protector. The electrostatic discharge protector 41 has such a structure that an insulating layer 35 having a rectangular cross section is disposed so as to cover the whole upper surface of a conductive member 33 in the above described electrostatic discharge protector 31.

The electrostatic discharge protector of the present invention is used as a protective circuit for releasing overcurrent to earth ground in order to protect a device at the time of electrostatic discharging. The electrostatic discharge protector of the present invention generally shows a high electric resistance value at the time of normal operating at a low voltage and feeds a current to the device without releasing the current to earth ground. Meanwhile, when transient phenomenon is caused at the time of electrostatic discharging, the electrostatic discharge protector shows a low electric resistance value instantly and releases overcurrent to earth ground and thereby prevents the device from feeding of overcurrent. When transient phenomenon is dissolved, the electrostatic discharge protector returns to have a high electric resistance value and feeds a current to the device. Since the electrostatic discharge protector of the present invention has the above structure, it exhibits such a function and realizes electrostatic discharge protection against devices and the like.

Figure 5:
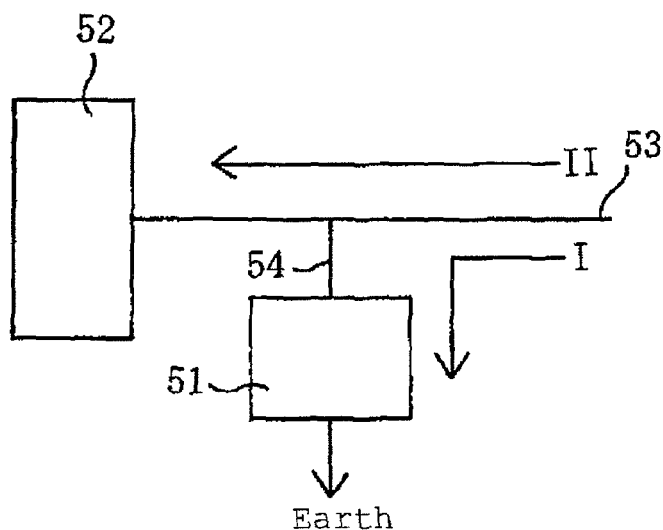
FIG. 5 is an illustrative view showing one embodiment of the electrostatic discharge protectors according to the present invention.

FIG. 5 shows an embodiment of using the electrostatic discharge protector of the present invention. The electrostatic discharge protector 51 is disposed on a wiring 54, which is branched from a wiring 53 leading to a device 52 and leads to earth ground. In FIG. 5, "I" shows a direction of electric current flow at the time of generating electrostatic discharge. "II" shows a direction of electric current flow at the time of normal operating.

The ESD protective circuit namely the electrostatic discharge protector can attain the object of protecting electrostatic discharge even if the electric resistance value is less than $10^8\Omega$ by leading overcurrent caused by overvoltage at the time of generating ESD from a protective circuit to earth ground, but some electric current leaks all the time even in the voltage at the time of normal operating. It is unfavorable that the electric resistance value in a voltage at the time of normal operating is less than $10^8\Omega$, because a leaked electric current is likely to affect the device as noise. According to the present invention, constituting the insulating layer disposed between the two wiring patterns which are electrodes, it is possible to attain the resistance value of not less than $10^8\Omega$ in the case of applying a voltage of not more than DC10V between the two electrode and thereby the electrostatic discharge protection can be realized surely.

Conductive Member

The electrode of the conductive members is a member, which passes a current from the one side to the other side. The shape and materials are not particularly limited as far as it can pass overcurrent at the time of generating electrostatic discharge, and the electrode may be disposed in normal electric wiring.

The conductive members other than the electrode are members of receiving a current flown from the electrode of one conductive member and further passing it to the other conductive member. The shape and materials of the conductive member are also not particularly limited as far as it can pass overcurrent at the time of generating electrostatic discharge. For example, the conductive members other than the electrode can be formed by a metal foil such as aluminum foil etc. and conductive materials containing a conductive filler and the like.

The materials of the conductive members other than the electrodes may include mixed materials obtainable by dispersing a conductive filler such as Ag powder, Ni powder, carbon powder, etc. in a resin, and further may include materials mixed in a binder, which materials comprise a resin as a main component and are obtainable by dipping a metal powder in a solution which comprises a chelating agent capable of dissolving the oxide film of the metal powder and a solvent for securing conductivity, thereby removing the natural oxide film from the metal surface, and forming a complex of the same metal.

As the resin contained in the above conductive members, a conductive resin is given. Examples of the conductive resin are a polyacetylene resin and a polypyrol resin doped with a specific compound, etc. With regard to the resin contained in the conductive members, the following materials, further, are favorably used in the viewpoint of reliability to stability with the elapse of time and the cost of the material. They are resin compositions obtainable by dispersing a conductive filler in a versatile resin. Examples of the resin used in the resin compositions are a natural resin, a modified resin and an oligomeric synthetic resin.

A typical example of the natural resin is rosin. Examples of the modified resin are a rosin derivative, a rubber derivative, etc. Examples of the oligomer synthetic resin are an epoxy resin, an acrylic resin, a maleic acid derivative, a polyester resin, a melamine resin, a polyurethane resin, a polyimide resin, a polyamic acid resin and a polyimide/amide resin.

The conductive members other than the electrodes have a foil, film, sheet or plate-like shape.

When a voltage of DC 10V is applied, the conductive members other than the electrodes have an electric resistance of preferably not more than $10^3 \Omega \cdot cm$, further preferably not more than $10^2 \Omega \cdot cm$. When the electric resistance is more than $10^3 \Omega \cdot cm$ or larger, they sometime do not show properties as an electrostatic discharge protector even by regulating the film thickness of the insulating member and furthermore they are hardly produced industrially.

The conductive members other than the electrodes are preferably molded articles formed from a conductive resin composition, and the molded articles are preferably layered articles. The conductive members other than electrodes are preferably molded articles formed from the conductive resin composition, because an electrostatic discharge protector can be formed on a necessary part in a necessary area simply, easily and freely without carrying out complicated steps. The molded articles are preferably layered articles prepared by coating and hardening because the electrostatic discharge protector can be formed readily.

When the molded article is a layered article, the thickness thereof is preferably not less than 1 μm and not more than 100 μm, more preferably not less than 10 μm and not more than 100 μm. When the thickness is less than 1 μm, the dispersion of the capability for ESD protection is larger. When the thickness is over 100 μm, the conductive member is easily delaminated by impact and the like in mounting.

The conductive resin composition preferably contains conductive particles and/or conductive fibers. In the conductive member, it is necessary to pass overcurrent for a nanosecond at the time of generating electrostatic discharge. When the conductive resin composition contains the conductive particles and/or the conductive fibers, such overcurrent can be moved smoothly.

The content of the conductive particles and/or the conductive fibers in the conductive resin composition is preferably 1 to 80% by volume, more preferably 50 to 75% by volume. In order to exhibit such a property that at the time of generating ESD, a short circuit is quickly caused, and at the time of canceling ESD, a short circuit is canceled and the insulating capability is reproduced, electric charge needs to be moved smoothly. In this viewpoint, the content is favorably 50 to 70% by volume. When the above content is less than 1% by volume, a low electric resistance property necessary for the conductive member is not obtained occasionally.

When the content is over 80% by volume, the conductive member is easily delaminated by impact etc. in mounting.

Examples of the conductive particle are carbon particles such as graphite, and carbon blacks including furnace black and ketchen black etc.; and metallic conductive particles such as nickel particles, aluminum particles, tungsten particles, niobium particles and tantalum particles. Of these, carbon particles are preferable and further graphite is particularly preferable. The conductive particles have an average particle diameter of 0.1 to 30 μm. The average particle diameter can be determined using a laser diffraction light scattering particle size distribution measuring apparatus Microtrac SPA (manufactured by Nikkiso Co., Ltd.).

Examples of the conductive fibers are carbon fiber and zinc oxide whisker. The conductive particles have a fiber diameter of preferably 0.1 to 30 μm.

As the conductive fibers, carbon fibers are preferred. When the conductive member contains the carbon particles and the carbon fibers, a property such that switching can be more easily performed can be added by a function as a kind of condenser in lowering a high electric resistance value for a nanosecond at the time of generating ESD. Furthermore, since the graphite and carbon fiber in a resin composition state have low cohesive force, the resin composition hardly has a high viscosity even if these contents are increased. When the concentration of the conductive resin composition is lowered by adding a solvent in order to regulate the printability, the graphite and the carbon fiber are scarcely separated, and thereby the stability with the elapse of time is added.

The conductive resin composition has a viscosity at 25° C. of preferably 2 to 200,000 mPa·s. In this viscosity rage, coating thereof can be carried out by any of potting, bar coating, screen printing and spin coating. When the viscosity is over 200,000 mPa·s, it is difficult to carry out printing, while when it is less than 2 mPa·s, it is difficult to prepare a uniform film thickness. The viscosity can be determined at 25° C. by an E type viscometer at a rotor revolution of 1 rpm.

As the solvent used for viscosity regulation, a solvent having a glycol skeleton is given because of having excellent solubility to the resin, light odor and easy handling. Examples thereof are ethylene glycol dimethylether, ethylene glycol diethylether, carbitol acetate, propyleneglycol methylether acetate, dipropyleneglycol methylether acetate, ethyl carbitol acetate and butyl carbitol acetate. Further examples of the solvent are γ-butyrolactone, toluene, xylene, ethyl benzene, nitrobenzene, isophorone, methylmethoxy propionate, ethylethoxy propionate, n-butyl acetate, N,N-dimethyl formamide and n-methyl pyrrolidone.

In the conductive member in which gaps are present, the switching function that the electric resistance value is changed at the time of generating ESD and at the time of canceling ESD. Between the case that the conductive member in which gaps are absent is formed by treating conductive particles with a surfactant, thereby preparing a resin composition and deforming and the case that the conductive member in which gaps are present is formed by kneading conductive particles and a slight amount of a binder resin, master batching and adding a resin, the voltages at which the ESD electric resistance value lowers (a voltage at which it operates as the ESD protective circuit, a voltage at ESD operating) are different each other. The voltage of the ESD protective circuit provided with the conductive member in which gaps are present more lowers, while since the ESD protective circuit provided with the conductive member in which gaps are absent has a high ESD operating voltage, it has a tendency that the capability to various ESD generating sources is insufficient.

The proportion of the gaps (gap proportion) is preferably not less than 5% by volume and not more than 50% by volume per the volume of the conductive member. When the gap proportion is less than 5% by volume, the effect of lowering the ESD operating voltage is low. When the gap proportion in the conductive layer is over 50% by volume, the conductive layer is easily delaminated by impact in mounting. The gap proportion is determined by obtaining a 400 time observation image from the cross section of the conductive member using a scanning electron microscope, measuring the area of the conductive member and the area of the gaps and determining the ratio of the area of the gaps to the area of the conductive layer.

Insulating Member

The insulating member is disposed so as to be sandwiched between the two conductive members. The insulating member shows a high electric resistance value at the time of normal operating and blocks flowing an electric current between the conductive members, while at the time of electrostatic discharging, it shows a low electric resistance value and has a function of flowing an electric current between the conductive members.

The thickness of the part where the insulating member is sandwiched between the two conductive members, namely the width of the gaps is 0.1 to 10 µm, preferably 0.2 to 7 µm. When the above thickness is over 10 µm, the voltage at the time of operating as the ESD protective circuit (ESD operating voltage) is higher than 5 kV. The sources of ESD generation are not only thunder surging at a voltage of over 10 kV but also surging at a voltage of around 8 kV caused by the human body and surging at a voltage of around 1 kV caused by friction and other various surging. On this account, in order to function as the ESD protective circuit, the ESD operating voltage is ineffective unless it is less than 5 kV. When the thickness is less than 0.1 µm, the insulating member does not stand up to repetition of the change of the electric resistance value at a high voltage for the ESD protection and the change of the electric resistance value at a low voltage. Furthermore, in the viewpoint of the stabilization of the gap distance, the above thickness, namely the gap width is preferably 1 to 10 µm.

The part where the insulating member is sandwiched from the both sides between the two conductive members has an area of the cross section orthogonal to the direction that it is sandwiched by the two conductive members of not less than 150 µm$^2$.

The shape of the insulating member is not particularly limited as far as the insulating member can perform the above function. As described above, the insulating member can also intervene in two or more gaps formed between the conductive members, and the shape can be determined properly so that the intervention can be made.

The materials of the insulating member are not particularly limited as far as the insulating member can perform the above function, and examples thereof are the resins used for the resin composition of the above-described conductive members.

The insulating member has an electric resistivity of preferably not less than $10^{10}$Ω·cm, more preferably not less than $10^{12}$Ω·cm at the time of applying a voltage of DC10V. When the electric resistivity is less than $10^{10}$Ω·cm, an electric current is leaked largely at the time of normal operating to cause noise occurrence occasionally in a device or the like which will ought to be protected.

The insulating member is preferably a molded article formed from the resin composition, and this molded article is preferably a layered article, namely an insulating layer. The insulating members are preferably molded articles formed from the resin composition because the electrostatic discharge protector can be formed at a necessary portion in a necessary area simply, easily and freely without carrying out specific complicated steps. This molded article is preferably a layered article obtainable by coating and curing because of capable of easily forming the electrostatic discharge protector.

The molded article which is a layered article has a thickness of preferably not less than 0.1 µm and less than 10 µm, more preferably not less than 0.2 µm and not more than 7 µm. When the thickness is in the above range, the ESD protection can be realized effectively as described above.

Examples of the resin contained in the above resin composition are a natural resin, a modified resin and an oligomeric synthetic resin.

A typical example of the natural resin is rosin. Examples of the modified resin are a rosin derivative and a rubber derivative. Examples of the oligomeric synthetic resin are an epoxy resin, an acrylic resin, a maleic acid derivative, a polyester resin, a melamine resin, a polyurethane resin, a polyimide resin, a polyamic acid resin and a polyimide/amide resin.

The resin contained in the above described resin composition is preferably a curable resin capable of curing with heat or an ultraviolet ray in order to keep the coating film strength.

Examples of the thermosetting resin are a carboxyl group-containing polyurethane resin, an epoxy compound or a combination of an epoxy compound with a compound containing an acid anhydride group, a carboxyl group, an alcoholic group or an amino group, and a combination of a compound containing a carboxyl group, an alcoholic group or an amino group with a compound containing a carbodiimide. Further examples are "COMPOCERAN E102" polyimide silica hybrid capable of thermosetting by introducing an alkoxysilane compound to a specific portion of a polyamic acid resin, and ring closing reaction of imide, hydrolysis of alkoxy silane and condensation (manufactured by Arakawa Chemical Industries, Ltd.) and the like.

Examples of the epoxy compound are epoxy compounds containing two or more epoxy groups in one molecule, such as a bisphenol A-type epoxy resin, a hydrogenated bisphenol A-type epoxy resin, a brominated bisphenol A-type epoxy resin, a bisphenol F-type epoxy resin, a novolac type epoxy resin, a phenol novolac type epoxy resin, a cresol novolac type epoxy resin, an alicyclic epoxy resin, an N-glycidyl type epoxy resin, a bisphenol A novolac type epoxy resin, a chelate type epoxy resin, a glyoxal type epoxy resin, an amino group-containing epoxy resin, a rubber modified epoxy resin, a dicyclopentadiene phenolic type epoxy resin, a silicon modified epoxy resin and a ε-caprolactam modified epoxy resin.

Moreover, epoxy compounds obtainable by introducing an atom of halogens such as chlorine, bromine, etc. or phosphorus into the structure may be used in order to add the flame retardance. Furthermore, it is permissible to use a bisphenol S-type epoxy resin, a diglycidyl phthalate resin, a heterocyclic epoxy resin, a bixylenol type epoxy resin, a biphenol type epoxy resin and a tetraglycidyl xylenoyl ethane resin.

As the epoxy resin, it is preferred to use an epoxy compound having two or more epoxy groups in one molecule. Furthermore, an epoxy compound having one epoxy group in one molecule may be used together. As the compound containing a carboxyl group, an acrylate compound is given and is not limited particularly. An alcoholic group-containing compound and an amino group-containing compound are given and also are not limited particularly.

Examples of the ultraviolet ray curable resin are compounds containing two or more ethylenic unsaturated groups such as an acrylic copolymer, an epoxy (meth) acrylate resin and a urethane (meth) acrylate resin.

Moreover, in the electrostatic discharge protector of the present invention, the insulating layer can be disposed as a surface protective film on the surface of the conductive member. In the electrostatic discharge protector 41 as shown in FIG. 5, the insulating layer 35 functions as the above surface protective film. The setting of the insulating layer as the surface protective film has a merit of preventing the conductive particles contained in the conductive member from elimination.

The insulating layer, which is the surface protective film can be formed by the same materials as those of the above described insulating member. Therefore, the insulating layer, which is the surface protective film can be formed using the above-described resin composition. When the resin composition is also used for forming the surface protective film, the resin composition is preferably the above described curable resin in order to keep its coating film strength.

Figure 6:
FIG. 6 shows a comb teeth-like wiring substrate.

The higher the voltage resistance, the more preferable the resin used for the resin composition. For example, the resin is applied on a wiring substrate having a comb teeth-like shape and a pitch of 30 μm (L/S=15 μm/15 μm) so that the dried film thickness is about 10 μm and cured to prepare a circuit. When the application at 8 kV in the HBM model in accordance with IEC61340-3-1 is repeated for the circuit 10 or more times, and a short circuit is not caused, the resin preferably has a tendency that even if the application resistance test is repeated as the electrostatic discharge protector, a short circuit is not caused. The comb teeth-like wiring substrate is shown in FIG. 6.

The resin composition may contain, as a filler for adding printability, an inorganic filler such as barium sulfate, silicon resin powder, silica fine particles and talc, and an organic filler such as a thermoplastic resin, a thermosetting resin and a rubbery polymer. When the resin composition contains the inorganic or organic filler, the voltage resistance can be added in many cases.

Examples of the resin composition may include commercial thermosetting type solder resist, NPR3300 containing a polyurethane resin as a main component, and barium sulfate and silica fine powder (manufactured by Nippn Polytech Corp.), and SN9000 containing a polyimide resin as a main component, and talc and silica fine powder (manufactured by Hitachi Chemical Co., Ltd.). The above resin composition is applied by screen printing so that the dried film thickness is 3 μm, and cured to form the insulating layer.

The resin composition has a viscosity at 25° C. of preferably 2 to 200,000 mPa·s from the same reason as that of the above described conductive resin composition. The solvent for regulating the viscosity is the same as that of the above described conductive resin composition.

The insulating member is required to have such properties that it is essential to show a high electric resistance value in normal operating at a low voltage and it also shows a low electric resistance value instantly in transient phenomena at the time of electrostatic discharging and further it is important to return a high electric resistance value when the electrostatic discharging is canceled and it is possible to repeat a high electric resistance value and a low electric resistance value.

The insulating member satisfying the above requirements according to the present invention can have the above properties surely without finely regulating the production conditions.

With regard to the repeating properties of the electric resistance value as ESD protection, when the application at 8 kV in HBM model in accordance with IEC61340-3-1 is repeated 10 times and consequently the resistance value is not changed, the insulating member is determined to have the repeating properties for ESD protection. This method can be also used for the electrostatic discharge protector.

The electrostatic discharge protector of the present invention is applied to electronic circuit boards and electronic equipments with the built-in the electronic circuit substrate, and is a useful technique, which is responsible to the demands of the industry that the ESD protective circuit is provided freely, simply and easily.

EXAMPLE

The present invention will be described in more detail with reference to the following examples below, but it should not be limited by these examples.

[Preparation of Electrostatic Discharge Protector]

On a polyimide film having a film thickness of 25 μm, one pair of electrode patterns (film thickness: 12 μm) were formed in a prescribed distance between the electrodes in such a way that the end surfaces of the electrode patterns are disposed to be faced each other in an arbitrary distance to prepare a wiring board. The wiring board is disposed on a hot plate heated at 120° C. The insulating resin composition prepared by the method described later was potted so as to bridge the ends faced each other in the one pair of electrodes and to prepare a prescribed dried film thickness. Furthermore, in accordance with necessity, a conductive resin composition was potted so as to have a prescribed dried film thickness on the layer formed by the insulating resin composition. In place of potting the conductive resin composition, a metal foil was placed on the layer formed by the insulating resin composition and contact bonded. Each layer was cured on the hot plate heated at 120° C. for 5 min and in a constant temperature vessel at 150° C. for 30 min. In this manner, an ESD protective circuit, namely, an electrostatic discharge protector was prepared. When the film thickness was made to be uniform, a coating film was formed so as to have a prescribed film thickness by screen printing and cured at 120° C. for 30 min and at 150° C. for 30 min.

[Method of Evaluating Insulating Properties at a Normal Operating Voltage]

Regarding the electrodes on the both ends of the electrostatic discharge protector, the resistance at the time of application of a voltage of DC10V was measured using an insulation resistance meter "MEGOHMMETER SM-8220" and the insulating properties at a normal operating voltage was determined by measuring the resistance at the time of application of a voltage of DC10V and taking the insulating properties at a normal operating voltage as the resistance at the time of normal operation from the resistance value in accordance with the following standard.

A: The electric resistance value is not less than $10^8 \Omega$.
C: The electric resistance value is less than $10^8 \Omega$.

[Method of Evaluating the Electric Resistivity of Insulating Layer]

On a polyimide film having a film thickness of 25 μm, the insulating resin composition used in the preparation of the insulating member was applied so as to prepare a prescribed dried film thickness and cured. Thereafter, on the coated surface, electrodes having a gap of 1 cm were formed by a silver paste. The electric resistivity at the time of application of a voltage of DC10V was measured using an insulation resistance meter "MEGOHMMETER SM-8220".

[Method of Evaluating the Electric Resistivity of Conductive Layer]

On a polyimide film having a film thickness of 25 μm, the conductive resin composition used in the preparation of the conductive member was applied so as to have a prescribed dried film thickness and dried. Thereafter, on the coated surface, electrodes having a gap of 1 cm were formed by a silver paste. The electric resistivity at the time of application of a voltage of DC10V was measured using an insulation resistance meter "MEGOHMMETER SM-8220".

[Method of Evaluating Voltage Resistance of Resin Used for Insulating Member]

The composition obtainable by removing the inorganic or organic filler from the insulating resin composition used in the preparation of the insulating member was applied on the wiring board having a 30 μm pitch (L/S=15 μm/15 μm) (shown in FIG. 6, wiring thickness: 15 μm, the distance between the adjacent wirings: 15 μm) so as to prepare a dried film thickness of 10 μm, and cured to prepare the insulating film. Then, the insulating film was installed in a semiconductor electrostatic tester ESS-6008 (manufactured by NOISE LABORATORY) and a 8 kV voltage was applied 10 times thereon. Thereafter, the resistance value in the application at a voltage of DC10V was measured using an insulation resistance meter "MEGOHMMETER SM-8220". The voltage resistance of the resin was evaluated from the resistance value in the following standard.

A: The resistance value is not less than $10^{10}\Omega$.
B: The resistance value is not less than $10^{8}\Omega$ and less than $10^{10}\Omega$.
C: The resistance value is less than $10^{8}\Omega$.

[Method of Evaluating Operating Properties for Electrostatic Discharge Protection]

The resulting electrostatic discharge protector was installed in a semiconductor electrostatic tester ESS-6008 (manufactured by NOISE LABORATORY) and a 2 kV voltage was applied thereon. The peak electric current was measured. The operating properties for electrostatic discharge protection were evaluated from the electric current value as resistance at the time of ESD generation in accordance with the following standard.

A: The electric current value is not less than 1 A.
B: The electric current value is not less than 0.6 A and less than 1 A.
C: The electric current value is less than 0.6 A.

[Method of Evaluating Resistance to Electrostatic Discharge Repetition Application]

The resulting electrostatic discharge protector was installed in a semiconductor electrostatic tester ESS-6008 (manufactured by NOISE LABORATORY) and a 8 kV voltage was applied 10 times thereon. The resistance value at the time of application of a voltage of 10 V was measured using an insulation resistance meter "MEGOHMMETER SM-8220". The resistance to electrostatic discharge repetition application was evaluated from the resistance value as high voltage resistance in accordance with the following standard.

A: The resistance value is not less than $10^{10}\Omega$.
B: The resistance value is not less than $10^{8}\Omega$ and less than $10^{10}\Omega$.
C: The resistance value is less than $10^{8}\Omega$.

Synthetic Example 1

To a reactor equipped with a stirrer, a thermometer and a condenser, 707 g of "C-1065N" (raw material diol molar ratio: 1,9-nonane diol:2-methyl-1,8-octane diol=65:35, molecular weight 991 manufactured by Kuraray Co., Ltd.) as polycarbonate diol, 135 g of 2,2-dimethylol butanoic acid (manufactured by Nippon Kasei Chemical Co., Ltd.) as a dihydroxyl compound having a carboxyl group and 1289 g of diethylene glycol ethyl ether acetate (manufactured by Daicel Chemical Industries Ltd) as a solvent were fed and all the raw materials were dissolved at 90° C. The temperature of the reaction solution was decreased to 70° C. and 424 g of "Desmodur-W" (methylenebis(4-cyclohexylisocyanate) manufactured by Sumika Bayer Urethane Ltd.) as polyisocyanate was dropped from a dropping funnel over 30 min. After the completion of dropping, the reaction was carried out at 80° C. for 1 hr, at 90° C. for 1 hr and at 100° C. for 2 hr until isocyanate was consumed. The consumption of isocyanate was confirmed by the way that the infrared absorption spectra of the reaction solution were measured and a peak at around 2300 cm$^{-1}$ assigned to isocyanate was disappeared. Thereafter, 146 g of isobutanol (manufactured by Wako Pure Chemical Industries Ltd.) was dropped and further reacted at 105° C. for 1.5 hr to prepare 2430 g of carboxyl group-containing polyurethane (U-1).

The resulting carboxyl group-containing polyurethane (U-1) had a solid component concentration of 50% by mass and a number average molecular weight of 12,000, and the acid value of the solid component was 39.9 mg KOH/g.

Synthetic Example 2

To a reactor equipped with a stirrer, a thermometer and a condenser, 1000 g of "PLACCEL CD-220" (manufactured by Daicel Chemical Industries Ltd.) as polycarbonate diol, 250 g of 4,4'-diphenylmethane diisocyanate and 834 g of γ-butyrolactone were fed and reacted at 160° C. for 5 hr. Furthermore, 358 g of 3,3',4,4'-diphenylsulfone tetracarboxylic acid 2-anhydride, 125 g of 4,4'-diphenylmethane diisocyanate and 585 g of γ-butyrolactone were fed, heated at 160° C. and reacted for about 5 hr until the average molecular weight, as measured by GPC, was 15,000 to prepare 3150 g of a polyimide resin solution.

Example 1

100 g of the carboxyl group-containing polyurethane resin prepared in Synthetic Example 1, 6.6 g of "Epicote 828EL" (bisphenol A type 2 functional epoxy resin manufactured by Japan Epoxy Resin Co., Ltd), 0.5 g of "1B2MZ" (manufactured by Shikoku Chemical Industries Co., Ltd) as a thermosetting catalyst and 22.8 g of diethylene glycol ethylether acetate were stirred using a homogenizer (60 rpm) for 15 min to prepare an insulating resin composition. The insulating resin composition was evaluated on the resistance value and the voltage resistance by the above methods.

To 50.0 g of the resin prepared in Synthetic Example 1, 50.0 g of "L4-3C" (aluminum particles, average particle diameter 5.5 μm manufactured by Showa Aluminum Powder K.K.), 50.0 g of "4sp-10" (nickel particles, average particle diameter 8 to 11 μm, manufactured by Nikko Rica Corporation), 3.3 g of "Epicote 828EL", and 0.3 g of "1B2MZ" were added and roughly kneaded. Next, the mixture was kneaded 3 times using a three roll mill to perform the main kneading. Furthermore, 0.5 g of "antifoaming silicon TSA750S" (manufactured by GE Toshiba Silicon Co., Ltd.) as a antifoaming agent, 270.0 g of diethylene glycol ethylether acetate were added and stirred to prepare a conductive resin composition. The conductive resin composition was evaluated on the resistance value by the above method.

To a wiring board having an electrode distance of 150 μm, the insulating resin composition was applied by screen printing so as to prepare a dried thickness over the electrodes of 7 μm and cured to prepare an insulating member. Thereafter, over the wiring electrode gap on the cured insulating member, the conductive resin composition was potted to prepare a conductive member having a dried film thickness of 25 μm. In this manner, an electrostatic discharge protector having the structure as shown in FIG. 3 was prepared. The gap between each electrode and the conductive member was 7 μm.

The electrostatic discharge protector was evaluated on the insulating properties at the time of normal operating, operating properties for electrostatic discharge protection and resistance to electrostatic discharge repetition application by the above methods. The results are shown in Table 1. With regard to the content of conductive particles contained in the conductive member, the aluminum particle content was 41.5% by volume and the nickel particle content was 12.6% by volume.

Example 2

20.0 g of "Epicote 1004" (bisphenol A type 2 functional epoxy resin manufactured by Japan Epoxy Resin Co., Ltd.), 5.0 g of "YH306" (acid anhydride manufactured by Japan Epoxy Resin Co., Ltd.), 0.2 g of 1,2-dimethyl imidazole (manufactured by Shikoku Chemicals Corporation) as a thermosetting catalyst, 22.5 g of diethylene glycol ethylether acetate and 0.4 g of "antifoaming silicon TSA750S" were mixed and stirred using a homogenizer (60 rpm) for 15 min to prepare an insulating resin composition. The resin composition was evaluated on the resistance value and voltage resistance by the above methods.

As the conductive resin composition, the conductive resin composition prepared in Example 1 was used.

On a wiring board having an electrode distance of 150 μm, the insulating resin composition was applied so as to prepare a dried film thickness over the electrodes of 9 μm, and cured to prepare an insulating member. Thereafter, over the wiring electrode gap on the cured insulating member, the conductive resin composition was potted to prepare a conductive member having a dried film thickness of 25 μm. In this manner, an electrostatic discharge protector having the structure as shown in FIG. 3 was prepared. The gap between each electrode and the conductive member was 9 μm.

The electrostatic discharge protector was evaluated on the insulating properties at the time of normal operating, operating properties for electrostatic discharge protection and resistance to electrostatic discharge repetition application by the above methods. The results are shown in Table 1.

Example 3

100 g of the polyimide resin solution prepared in Synthetic Example 2 and 3.0 g of "Aerosil 380" (silica particles, average particle diameter: 0.2 μm, manufactured by Nippon Aerosil Co., Ltd.) were stirred using a planetary mixer at 60 rpm for 30 min. Thereafter, 1 g of "YH-434" (amine type epoxy resin manufactured by Touto Kasei Co., Ltd.) and 28.0 g of γ-butyrolactone were added and further stirred for 15 min to prepare an insulating resin composition. The insulating resin composition was evaluated on the resistance value and the voltage resistance by the above methods.

To 12.5 g of "Epicote 1004", 2.5 g of "Nanostrength MAN" (methacrylate/acrylate/block polymer manufactured by Arkema) as an organic filler, 7.5 g of "Adisper-2E822" (manufactured by Ajinomoto Fine Chemicals Co.) as a dispersing agent, 120.0 g of "23 k" (doped zinc oxide 125Ω·cm, Volume average diameter of 4 to 7 μm, manufactured by Hakusui Tech) and 61.1 g of diethylene glycol diethylether were added and roughly kneaded. Next, the mixture was kneaded 3 times using a three roll mill to perform the main kneading. Furthermore, 0.6 g of "antifoaming silicon TSA750S" and 270.0 g of diethylene glycol ethylether acetate were added and stirred to prepare a conductive resin composition. The conductive resin composition was evaluated on the resistance value by the above method.

To a wiring board having an electrode distance of 150 μm, the insulating resin composition was applied by screen printing so as to prepare a dried thickness over the electrodes of 4 μm and cured to prepare an insulating member. Thereafter, over the wiring electrode gap on the cured insulating member, the conductive resin composition was potted to prepare a conductive member having a dried film thickness of 50 μm. In this manner, an electrostatic discharge protector having the structure as shown in FIG. 3 was prepared. The gap between each electrode and the conductive member was 4 μm.

The electrostatic discharge protector was evaluated on the insulating properties at the time of normal operating, operating properties for electrostatic discharge protection and resistance to electrostatic discharge repetition application by the above methods. The results are shown in Table 1. With regard to the content of conductive particles contained in the conductive member, the conductive zinc oxide content was 50.7% by volume.

Example 4

As the insulating resin composition, the insulating resin composition prepared in Example 1 was used.

To 50.0 g of the resin prepared in Synthetic Example 1, 100.0 g of "UF-G30" (artificial graphite powders, average particle diameter 10 μm manufactured by Showa Denko K.K.), 3.3 g of "Epicote 828EL" and 0.3 g of "1B2MZ" were added and roughly kneaded. Next, the mixture was kneaded 3 times using a three roll mill to perform the main kneading. Furthermore, 0.5 g of "antifoaming silicon TSA750S" (manufactured by GE Toshiba Silicon Co., Ltd.) as an antifoaming agent, 270.0 g of diethylene glycol ethylether acetate were added and stirred to prepare a conductive resin composition. The conductive resin composition was evaluated on the resistance value by the above method.

To a wiring board having an electrode distance of 150 μm, the insulating resin composition was applied by screen printing so as to prepare a dried thickness over the electrodes of 5 μm and cured to prepare an insulating member. Thereafter, over the wiring electrode gap on the cured insulating member, the conductive resin composition was potted to prepare a conductive member having a dried film thickness of 35 μm. In this manner, an electrostatic discharge protector having the structure as shown in FIG. 3 was prepared. The gap between each electrode and the conductive member was 5 μm.

The electrostatic discharge protector was evaluated on the insulating properties at the time of normal operating, operating properties for electrostatic discharge protection and resistance to electrostatic discharge repetition application by the above methods. The results are shown in Table 1. With regard to the content of conductive particles contained in the conductive member, the artificial graphite particle content was 69.0% by volume.

Example 5

As the insulating resin composition, the insulating resin composition prepared in Example 1 was used.

To 50.0 g of the resin prepared in Synthetic Example 1, 30.0 g of "VGCF" (carbon fiber 0.013Ω·cm manufactured by Showa Denko K.K.), 3.3 g of "Epicote 828EL" and 0.3 g of "1B2MZ" were added and roughly kneaded. Next, the mixture was kneaded 3 times using a three roll mill to perform the main kneading. Furthermore, 0.5 g of "antifoaming silicon TSA750S" (manufactured by GE Toshiba Silicon Co., Ltd.) as an antifoaming agent, 270.0 g of diethylene glycol ethylether acetate were added and stirred to prepare a conductive resin composition. The conductive resin composition was evaluated on the resistance value by the above method.

To a wiring board having an electrode distance of 150 μm, the insulating resin composition was applied by screen printing so as to prepare a dried thickness over the electrodes of 8 μm and cured to prepare an insulating member. Thereafter, over the wiring electrode gap on the cured insulating member, the conductive resin composition was potted to prepare a conductive member having a dried film thickness of 20 μm. In this manner, an electrostatic discharge protector having the structure as shown in FIG. 3 was prepared. The gap between each electrode and the conductive member was 8 μm.

The electrostatic discharge protector was evaluated on the insulating properties at the time of normal operating, operating properties for electrostatic discharge protection and resistance to electrostatic discharge repetition application by the above methods. The results are shown in Table 1. With regard to the content of conductive particles contained in the conductive member, the carbon fiber content was 40.0% by volume.

Example 6

100 g of the carboxyl group-containing polyurethane resin prepared in Synthetic Example 1 and 22.8 g of diethylene glycol ethylether acetate were mixed and stirred using a homogenizer (60 rpm) for 15 min to prepare an insulating resin composition. The resin composition was evaluated on the resistance value and voltage resistance by the above methods.

As the conductive resin composition, the conductive resin composition prepared in Example 5 was used.

On a wiring board having an electrode distance of 150 μm, the insulating resin composition was applied so as to prepare a dried film thickness over the electrodes of 3 μm, and dried to prepare an insulating member. Thereafter, over the wiring electrode gap on the cured insulating member, the conductive resin member (sic composition) was potted to prepare a conductive member having a dried film thickness of 20 μm. In this manner, an electrostatic discharge protector having the structure as shown in FIG. 3 was prepared. The gap between each electrode and the conductive member was 3 μm.

The electrostatic discharge protector was evaluated on the insulating properties at the time of normal operating, operating properties for electrostatic discharge protection and resistance to electrostatic discharge repetition application by the above methods. The results are shown in Table 1. Since a curing component is not added to the insulating member, the interface between the insulating layer and the conductive layer was dissolved.

Example 7

100 g of the carboxyl group-containing polyurethane resin prepared in Synthetic Example 1 and 22.8 g of diethylene glycol ethylether acetate were mixed and stirred using a homogenizer (60 rpm) for 15 min to prepare an insulating resin composition. The resin composition was evaluated on the resistance value and voltage resistance by the above methods.

On a wiring board having an electrode distance of 150 μm, the insulating resin composition was applied by screen printing and an aluminum foil (12 μm manufactured by Nippon Foil Mfg Co., Ltd.) was put over the wiring electrode gap on the insulating member, contact bonded and thermally cured at 150° C. The insulating member over the electrodes had a dried film thickness of 0.2 μm.

The electrostatic discharge protector was evaluated on the insulating properties at the time of normal operating, operating properties for electrostatic discharge protection and resistance to electrostatic discharge repetition application by the above methods. The results are shown in Table 1.

Comparative Example 1

The insulating member and the conductive member were prepared in the same manner as that of Example 1. The insulating member had a film thickness over the electrode (the gap between each electrode and the conductive member) of 12 μm. The electrostatic discharge protector was evaluated on the insulating properties at the time of normal operating, operating properties for electrostatic discharge protection and resistance to electrostatic discharge repetition application by the above methods. The results are shown in Table 1.

Comparative Example 2

The conductive member was prepared and the electrostatic discharge protector free from an insulating layer was prepared in the same manner as that of Example 1. The electrostatic discharge protector was evaluated on the insulating properties at the time of normal operating, operating properties for electrostatic discharge protection and resistance to electrostatic discharge repetition application by the above methods. The results are shown in Table 1.

Comparative Example 3

On a wiring board having an electrode distance of 9 μm, "NPR3300" (thermosetting solder resist manufactured by Nippon Polytech Corp.) was applied by screen printing so as to prepare a dried thickness over the electrodes of 9 μm and cured. A conductive layer was not provided. The electrostatic discharge protector was evaluated on the basic properties, namely, resistance at the time of normal operating, resistance at the time of ESD generation and high voltage resistance which is one of repetition properties by the above methods. The results are shown in Table 1.

TABLE 1

| | Distance between electrodes in Wiring board (μm) | Insulating member | | | |
|---|---|---|---|---|---|
| | | Resin | Voltage resistance of Resin (8 kV) | Particles | Electric resistivity (Ω · cm) | Thickness (μm) |
| Example | | | | | | |
| 1 | 150 | Synthetic Example 1 | A | None | 1.0E+12 | 7 |
| 2 | 150 | EP 1004 | B | None | 1.0E+12 | 9 |
| 3 | 150 | Synthetic Example 2 | B | Aerozyl | 1.0E+12 | 4 |
| 4 | 150 | Synthetic Example 1 | A | None | 1.0E+12 | 5 |
| 5 | 150 | Synthetic Example 1 | A | None | 1.0E+12 | 8 |

TABLE 1-continued

| | | | | | | |
|---|---|---|---|---|---|---|
| 6 | 150 | Synthetic Example 1 free from epoxy | A | None | 1.0E+12 | 3 |
| 7 | 150 | Synthetic Example 1 free from epoxy | A | None | 1.0E+12 | 0.2 |
| Comparative Example | | | | | | |
| 1 | 150 | Synthetic Example 1 | A | None | 1.0E+12 | 12 |
| 2 | 150 | None | None | None | None | None |
| 3 | 9 | NPR3300 | A | BaSO$_4$, silica | 1.0E+12 | 9 |

| | Conductive member | | | | Properties of Electrostatic discharge protector | | |
|---|---|---|---|---|---|---|---|
| | | | | | Resistance | | |
| | Resin | Particle | Electric resistivity ($\Omega \cdot$ cm) | Thickness ($\mu$m) | Resistance at normal operating | at ESD generation | High voltage resistance |
| Example | | | | | | | |
| 1 | Synthetic Example 1 | Al, Ni | 1.0E+0.3 | 25 | A | B | A |
| 2 | Synthetic Example 1 | Al, Ni | 1.0E+0.3 | 25 | A | A | C |
| 3 | EP1002 | Zinc oxide | 1.0E+0.4 | 50 | A | B | B |
| 4 | Synthetic Example 1 | Graphite | 1.0E+0.2 | 35 | A | A | A |
| 5 | Synthetic Example 1 | Carbon fibers | 1.0E+0.2 | 20 | A | A | A |
| 6 | Synthetic Example 1 | Carbon fibers | 1.0E+0.2 | 20 | A | A | C |
| 7 | — | — | — | Aluminum foil 12 | A | A | A |
| Comparative Example | | | | | | | |
| 1 | Synthetic Example 1 | Al, Ni | 1.0E+0.3 | 25 | A | C | A |
| 2 | Synthetic Example 1 | Al, Ni | 1.0E+0.3 | 25 | C | A | A |
| 3 | None | None | None | None | A | C | A |

The electrostatic discharge protector needs to have excellent basic properties as an electrostatic discharge protector, namely good resistance at the time of normal operating and good resistance at the time of ESD generation. Furthermore, the electrostatic discharge protector preferably has good repeating properties i.e. good high voltage resistance.

In Examples 1, 4 and 5, as a result, the basic properties of the electrostatic discharge protector, namely the resistance at the time of normal operating and the resistance at the time of ESD generation were good and the repeating properties i.e. the high voltage resistance were also good.

In the electrostatic discharge protector obtained in Example 2, the basic properties were good but the repeating properties, i.e. high voltage resistance lowered. It is considered that this is caused by the fact the resin used in the insulating member has low voltage resistance.

In Example 3, the high voltage resistance was more improved by using silica particles for the resin composition of the insulating member as compared with that in Example 2.

In Example 6, the basic properties of the electrostatic discharge protector were good. However, the repeating properties i.e. high voltage resistance lowered because a curable resin such as an epoxy resin etc. was not blended with the resin composition of the insulating member.

In Example 7, the aluminum foil was used as the conductive member and the insulating member was made to have a thickness of 0.2 μm. As a result, the resistance at the time of ESD generation lowered and the high voltage resistance could be kept.

In Comparative Example 1, the gap between the electrode and the conductive member was over 10 μm. As a result, the resistance at the time of ESD generation was excessively high.

In Comparative Example 2, the insulating member was absent. As a result, the resistance at the time of normal operating was too low.

In Comparative Example 3, the conductive member was absent. As a result, the resistance at the time of ESD generation was excessively high.

DESCRIPTION OF MARKS

11 . . . Electrostatic discharge protector
12A . . . Electrode

12B ... Electrode
13 ... Conductive member
14A ... Insulating member
14B ... Insulating member
21 ... Electrostatic discharge protector
22A ... Electrode
22B ... Electrode
23 ... Conductive member
24A ... Insulating member
24B ... Insulating member
31 ... Electrostatic discharge protector
32A ... Electrode
32B ... Electrode
33 ... Conductive member
34 ... Insulating member
41 ... Electrostatic discharge protector
35 ... Insulating layer
51 ... Electrostatic discharge protector
52 ... Device
53 ... Wiring
54 ... Wiring
I ... Direction at which an electric current flows at the time of electrostatic discharge generation
II ... Direction at which an electric current flows at the time of normal operating

The invention claimed is:

1. An electrostatic discharge protector comprising at least three conductive members containing a pair of electrodes and conductive members other than the electrodes wherein each conductive member is disposed so as to have a gap width of 0.1 to 10 μm between one conductive member and at least one of other conductive members, an insulating member is disposed and embedded in at least one of gaps having a width of 0.1 to 10 μm which are adjacent to each conductive member, and one of the electrodes is connected to the other electrode paired with the one electrode through the insulating member and the conductive members other than the electrodes, wherein the insulating member is a molded article obtainable by applying a curing resin composition comprising a curing resin and then curing.

2. An electrostatic discharge protector comprising a pair of electrodes, a conductive member disposed to have a gap width of 0.1 to 10 μm with each of the pair of the electrodes and an insulating member, which is disposed in the gap and connects each of the electrodes and the conductive member.

3. The electrostatic discharge protector according to claim 1 wherein the insulating member has an electric resistivity of $10^{10}$ Ω·cm or more at the time of applying a voltage of DC10V.

4. The electrostatic discharge protector according to claim 1 wherein the molded article is a layered article.

5. The electrostatic discharge protector according to claim 1 wherein the resin composition comprises an inorganic or organic filler.

6. The electrostatic discharge protector according to claim 1 wherein the conductive members other than the electrodes have an electric resistivity of not more than $10^3$ Ω·cm at the time of applying a voltage of DC10V.

7. The electrostatic discharge protector according to claim 1 wherein the conductive members other than the electrodes are molded articles comprising a conductive resin composition.

8. The electrostatic discharge protector according to claim 7 wherein the molded articles comprising the conductive resin composition are layered articles having a thickness of 1 to 100 μm.

9. The electrostatic discharge protector according to claim 7 wherein the conductive resin composition comprises conductive particles and/or conductive fibers in an amount of 1 to 80% by volume.

10. The electrostatic discharge protector according to claim 9 wherein the conductive particles are carbon particles.

11. The electrostatic discharge protector according to claim 9 wherein the conductive particles are graphite, and the conductive fibers are carbon fibers.

12. The electrostatic discharge protector according to claim 1 wherein the gap width is 1 to 10 μm.

13. An electronic circuit board obtainable by providing the electrostatic discharge protector as claimed in claim 1.

14. An electronic apparatus obtainable by providing the electronic circuit board as claimed in claim 13.

* * * * *